US006370055B1

(12) United States Patent
Hanson et al.

(10) Patent No.: US 6,370,055 B1
(45) Date of Patent: Apr. 9, 2002

(54) SEMICONDUCTOR MEMORY HAVING ASYMMETRIC COLUMN ADDRESSING AND TWISTED READ WRITE DRIVE (RWD) LINE ARCHITECTURE

(75) Inventors: David Hanson, Brewster; Gerhard Mueller, Wappingers Falls; Toshiaki Kirihata, Poughkeepsie, all of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/795,761

(22) Filed: Feb. 28, 2001

(51) Int. Cl.[7] .................................................. G11C 5/06
(52) U.S. Cl. ........................ 365/63; 365/69; 365/230.03; 365/214; 365/51
(58) Field of Search .............................. 365/63, 51, 69, 365/214, 230.03

(56) References Cited

U.S. PATENT DOCUMENTS

| | | | |
|---|---|---|---|
| 5,018,100 A | * 5/1991 | Yanagisawa | 365/230.03 |
| 5,541,882 A | 7/1996 | Houston | 365/194 |
| 5,949,698 A | 9/1999 | Shirley | 365/51 |
| 6,043,562 A | 3/2000 | Keeth | 257/776 |
| 6,069,815 A | 5/2000 | Mueller et al. | 365/63 |
| 6,111,774 A | 8/2000 | Shirley | 365/51 |
| 6,157,588 A | * 12/2000 | Matsumoto et al. | 365/214 |
| 6,205,548 B1 | * 3/2001 | Hasbun | 713/2 |

OTHER PUBLICATIONS

Kirihata et al., A 220mm$^2$ 4 and 8 Bank 256Mb SDRAM with Single–Sided Stitched WL Architecture, Dig. Tech. Papers, pp. 78–79, 1999.

Kim et al., "A 640MB/s Bi–Directional Data Strobed, Double–Data–Rate SDAM with a 40mW DLL Circuit for a 256MB Memory System" 1998 IEE International Solid State Circuits Conference, Dig. Tech. Papers, pp. 158–159, Jan. 1998.

Kirihata et al., "An 390–mm$^2$, 16–Bank, 1–Gb DDr SDRAM with Hybrid Bitline Architecture", IEEE Journal of Solid–State Circuits, vol. 34, No. 11, Nov. 1999.

* cited by examiner

Primary Examiner—Richard Elms
Assistant Examiner—VanThu Nguyen

(57) ABSTRACT

There is provided a semiconductor memory having a plurality of memory units. The memory includes a plurality of read write drive (RWD) lines horizontally and/or vertically twisted such that the RWD lines are shared between the plurality of memory units. A plurality of columns is included in each of the plurality of memory units. Each of the plurality of columns is adapted to access the plurality of RWD lines through asymmetrical addressing.

11 Claims, 7 Drawing Sheets

SEMICONDUCTOR MEMORY HAVING ASYMMETRIC COLUMN ADDRESSING AND TWISTED READ WRITE DRIVE (RWD) LINE ARCHITECTURE

BACKGROUND

1. Technical Field

The present invention generally relates to semiconductor memories and, in particular, to semiconductor memories having asymmetric column addressing and twisted read write drive (RWD) line architecture.

2. Background Description

It is common for semiconductor memory chip densities to increase by a factor of four with each subsequent generation. As a result, semiconductor memory chips become larger and more difficult to manufacture cost-effectively. As is known, reductions in the number of on-chip control or data signals can directly impact the size of the chip.

FIG. 1 is a block diagram illustrating a Dynamic Random Access Memory (DRAM), according to the prior art. The DRAM includes four units (Unit0, Unit1, Unit2, and Unit3), wherein only one of the four units is accessed as a bank for data read or write operations. More particularly, when a wordline (WL) is activated, the corresponding cells coupled to the wordline are enabled. The data bits read from the cells are amplified by the sense amplifiers and selected by column select line (CSL), which is well known and thus omitted from the Figures for the sake of simplicity. The decoder circuitry for selecting a WL and a CSL are row decoders and column decoders, respectively. The corresponding amplified and selected data bits are then transferred to second sense amplifiers (SSAs) through the master data lines (MDQs).

In this example, only one MDQ line is shown in the array for simplicity. However, the actual array contains a plurality of MDQ lines (i.e., 64) to transfer a plurality of data bits simultaneously. The SSA circuitry amplifies the data bits on the MDQ, and communicates to the DQ circuitry through the data lines.

The data lines that supply data into and drive data from the units are referred to herein as on-chip data lines and also as Read Write Drive (RWD) lines. In this example, the DRAM includes 16 DQs, thus requiring 16 RWD lines to communicate 16 bit data between each unit and the 16 DQ pins. The designation "DQ" represents the data port of the DRAM in which data is written to, or read from.

Note that laser blowable fuses (fuses) for redundancy replacement are arranged near row decoders and column decoders. Because of the nature of the fuses, wiring over the fuses is not permitted. This makes it difficult to share the data lines between two units.

FIG. 2 is a block diagram illustrating a semiconductor memory architecture that reduces the number of read write drive (RWD) lines by a factor of 2, according to the prior art. The reduction is achieved by twisting the RWD lines to share the RWD lines between the units. Right RWD lines are twisted connecting Unit0 to Unit1 and to Unit3 and twist again as they connect to Unit2. Similarly, eight RWD lines are twisted connecting the Unit1 to Unit0 and to Unit2 and twist again as they connect to Unit3. The conventional semiconductor memory architecture shown in FIG. 2 is described by Kim et al., in "A 640 MB/s Bi-Directional Data Strobed, Double-Data Rate SDRAM with a 40 mW DLL Circuit for a 256 MB Memory System", 1998 IEEE International Solid-State Circuits Conference, Digest of Technical Papers, pp. 158–159, Jan. 1998.

However, this article does not describe the idea of asymmetrical addressing. A 2-bit (2b) pre-fetch architecture requires address incrementing, thus requiring proper address assignment to simplify the data bit handling. If addresses are not properly assigned, the twisting of the RWD lines increases the complexity of the peripheral circuitry. Moreover, the article limits the idea of RWD line twisting to 2b prefetch.

An address incremented 2b prefetch architecture is described by Kirihata et al., "A 220 mm$^2$ 256 Mb SDRAM with Single-Sided Stitched WL Architecture", 1998 IEEE International Solid-State Circuits Conference, Digest of Technical Papers, pp. 78–79, January 1998. This architecture divides the array into even and odd arrays and, as with the architecture of FIG. 2, also requires an additional set of RWD lines for pre-fetch. This is because the address assignment for incrementing is symmetrical, making RWD line twisting difficult.

Accordingly, there is a need for a semiconductor memory having twisted read write drive (RWD) line architecture and pre-fetch capability. Moreover, there is a need for a semiconductor memory having twisted RWD line architecture and a reduced number of RWD lines.

SUMMARY OF THE INVENTION

The problems stated above, as well as other related problems of the prior art, are solved by the present invention, a semiconductor memory having asymmetric column addressing and twisted read write drive (RWD) line architecture.

The present invention advantageously allows n-bit pre-fetch and the increased performance associated therewith. A further advantage is a reduction in the number of read write drive (RWD) lines (on-chip input/output lines) by a factor of two or more. Another advantage is that the reduced number of RWD lines decreases the length of the semiconductor memory, thus resulting in higher yield and lower manufacturing costs. Yet another advantage is that by sharing the RWD lines, complex data multiplexing logic is eliminated. For example, in the prior art, a series of data multiplexers and logic circuits are necessary to select 16 of the 32 RWD lines.

According to a first aspect of the invention, there is provided a method for reducing read write drive (RWD) lines in a semiconductor memory having a plurality of memory units. Each of the plurality of memory units includes a plurality of columns. The method includes the step of twisting the RWD lines horizontally and/or vertically such that the RWD lines are shared between the plurality of memory units. Each of the plurality of columns included in each of the plurality of memory units are asymmetrically arranged, so as to provide access to the RWD lines through asymmetrical addressing.

According to a second aspect of the invention, the arranging step includes the step of asymmetrically arranging each of the plurality of columns such that a column in one of the plurality of memory units is disposed above or below another column in another one of the plurality of memory units, the column and the other column being asymmetric with respect to accessing the RWD lines through even addresses and odd addresses.

According to a third aspect of the invention, the RWD lines include even RWD lines and odd RWD lines, and the arranging step shares the even RWD lines and the odd RWD lines between the plurality of memory units.

According to a fourth aspect of the invention, the arranging step further includes the step of restricting opposing columns from having a same pre-fetch addressing.

According to a fifth aspect of the invention, the plurality of RWD lines include orthogonal or diagonal metal lines.

According to a sixth aspect of the invention, the semiconductor memory further includes a fuse bank, and the method further includes the step of dividing the fuse bank to provide space for implementing the twisting step.

According to a seventh aspect of the invention, there is provided a semiconductor memory having a plurality of memory units. The memory includes a plurality of read write drive (RWD) lines horizontally and/or vertically twisted such that the RWD lines are shared between the plurality of memory units. A plurality of columns are included in each of the plurality of memory units, each of the plurality of columns being adapted to access the plurality of RWD lines through asymmetrical addressing.

According to an eighth aspect of the invention, each of the plurality of columns are asymmetrically arranged such that a column in one of the plurality of memory units is disposed above or below another column in another one of the plurality of memory units, the column and the other column being asymmetric with respect to accessing the RWD lines through even addresses and odd addresses.

According to a ninth aspect of the invention, the RWD lines include even RWD lines and odd RWD lines, and the arranging step shares the even RWD lines and the odd RWD lines between the plurality of memory units.

According to a tenth aspect of the invention, opposing columns are restricted from having a same pre-fetch addressing.

According to an eleventh aspect of the invention, the plurality of RWD lines include orthogonal or diagonal metal lines.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

The present invention is directed to a semiconductor memory having asymmetric column addressing and twisted read write drive (RWD) line architecture. It is to be appreciated that while the present invention is described herein with respect to dynamic random access memories (DRAMs), the present invention is applicable to any type of semiconductor memory.

It is to be understood that the present invention may be implemented in various forms of hardware, software, or a combination thereof.

The present invention provides a pre-fetch architecture that reduces the number of read write drive (RWD) lines by a factor of 2 or more. This is achieved by horizontally and/or vertically twisting the RWD lines to share the RWD lines between the Units and the use of asymmetric column addressing methods.

Figure 1:
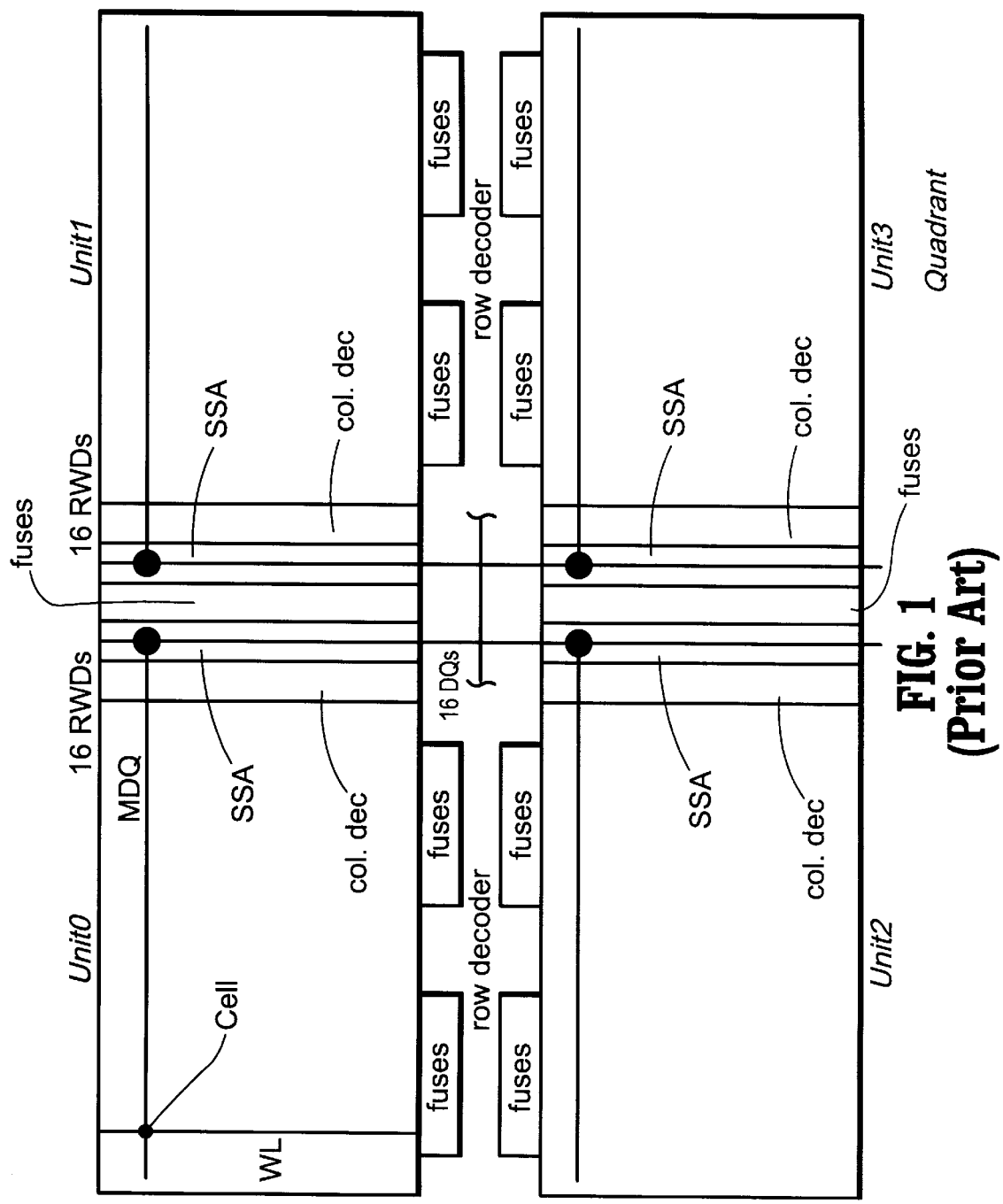
FIG. 1 is a block diagram illustrating a Dynamic Random Access Memory (DRAM), according to the prior art.
Figure 2:
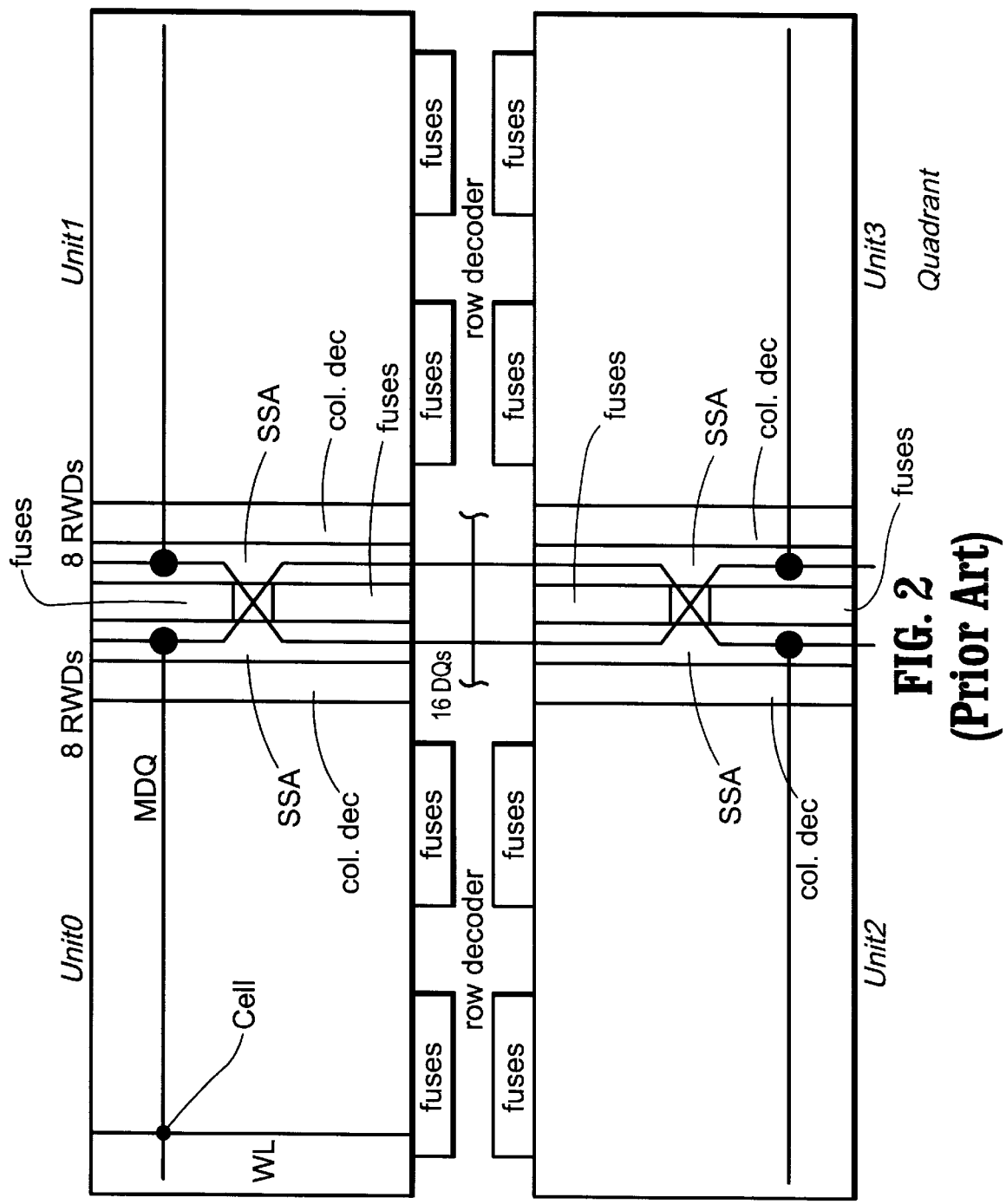
FIG. 2 is a block diagram illustrating a semiconductor memory architecture that reduces the number of read write drive (RWD) lines by a factor of 2, according to the prior art.
Figure 3:
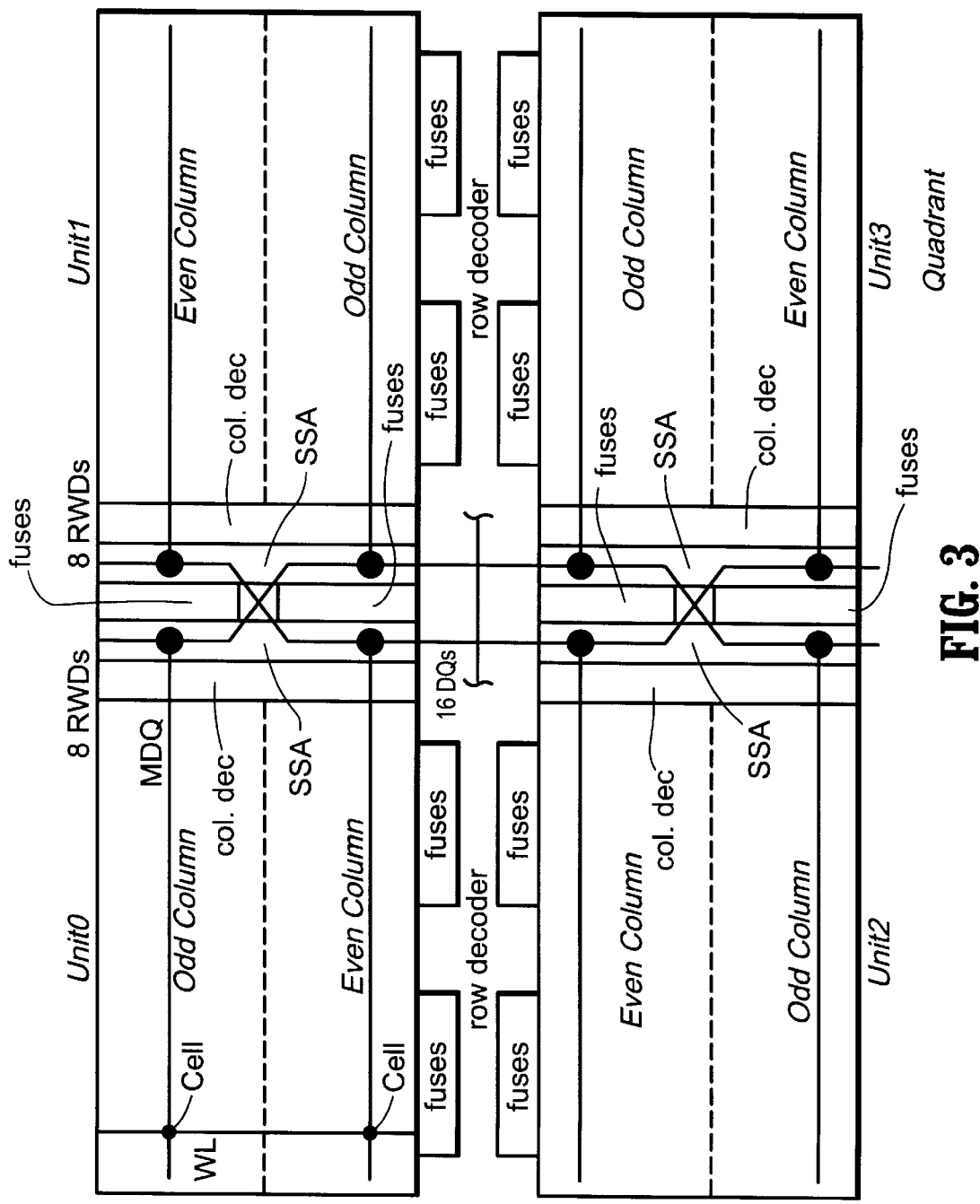
FIG. 3 is a block diagram illustrating a semiconductor memory employing horizontal twisting of read write drive (RWD) lines, according to an illustrative embodiment of the invention.

FIG. 3 is a block diagram illustrating a semiconductor memory employing horizontal twisting of read write drive (RWD) lines, according to an illustrative embodiment of the invention. The column address space is divided into 2 parts, Even and Odd, for the 2b pre-fetch. The column address space is arranged asymmetrically. That is, the Odd Column is physically disposed on top of the Even Column for Unit0 and Unit3 and the Even Column is physically disposed on top of the Odd Column for Unit 1 and Unit2. Asymmetric column address assignment allows Even and Odd RWD lines to be shared between Unit0, Unit1, Unit2, and Unit3, thereby resulting in half the number of RWD lines in 2b pre-fetch architectures.

Figure 4:
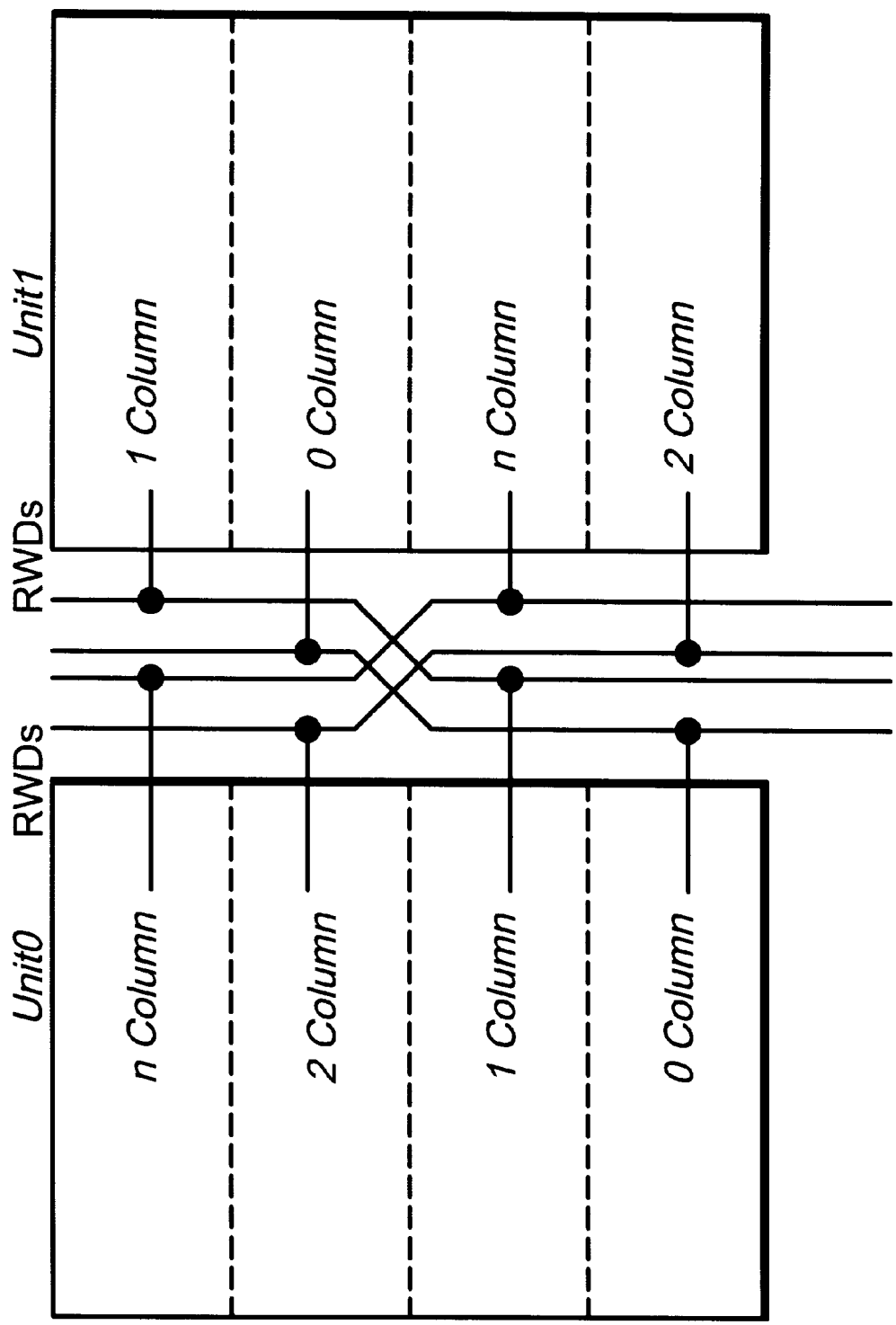
FIG. 4 is a block diagram illustrating two units of a semiconductor memory employing horizontal twisting of read write drive (RWD) lines that allows n-bit pre-fetch, according to an illustrative and preferred embodiment of the invention.

It is to be appreciated that the present invention is expandable to n-bit pre-fetch architectures. The main idea of this architecture is to arrange the same pre-fetch bit addressing in physically different segments in the two units. FIG. 4 is a block diagram illustrating two units of a semiconductor memory employing horizontal twisting of read write drive (RWD) lines that allows n-bit pre-fetch, according to an illustrative and preferred embodiment of the invention. The 0 Column to n Column can be asymmetrically arranged in any combination to allow n-bit Pre-fetch as long as there is a restriction upon opposing column blocks being identical. In FIG. 4 for example, 0 Column of Unit1 cannot be in the bottom space currently occupied by 2 Column of Unit1 to avoid duplicated RWD lines for 0 Column. As long as the columns with the same pre-fetch data are arranged in physically different segments, duplicated RWD lines can be avoided by twisting the RWD lines.

Figure 5:
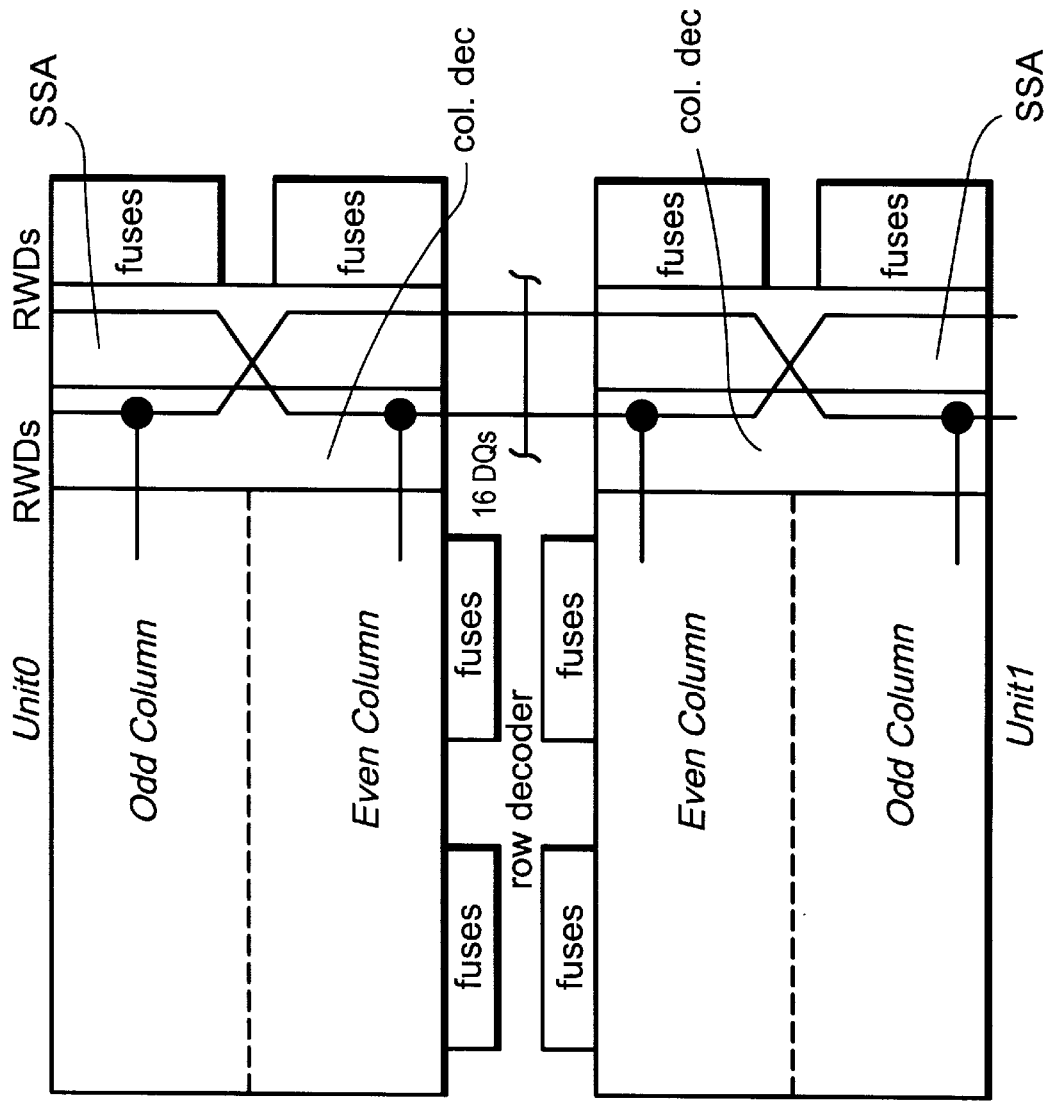
FIG. 5 is a block diagram illustrating two units of a semiconductor memory employing vertical twisting of read write drive (RWD) lines, according to an illustrative embodiment of the invention.

FIG. 5 is a block diagram illustrating two units of a semiconductor memory employing vertical twisting of read write drive (RWD) lines, according to an illustrative embodiment of the invention. Here the column address space is divided into 2 parts, even and odd. The column address space is arranged asymmetrically. That is, the Odd Column is physically disposed on top of the Even Column for Unit0 and the Even Column is physically disposed on top of the Odd Column for Unit 1. This vertical twist with asymmetric column address assignment allows Even and Odd RWD lines to be shared between Unit0 and Unit1, thereby resulting in half the number of RWD lines.

Figure 6:
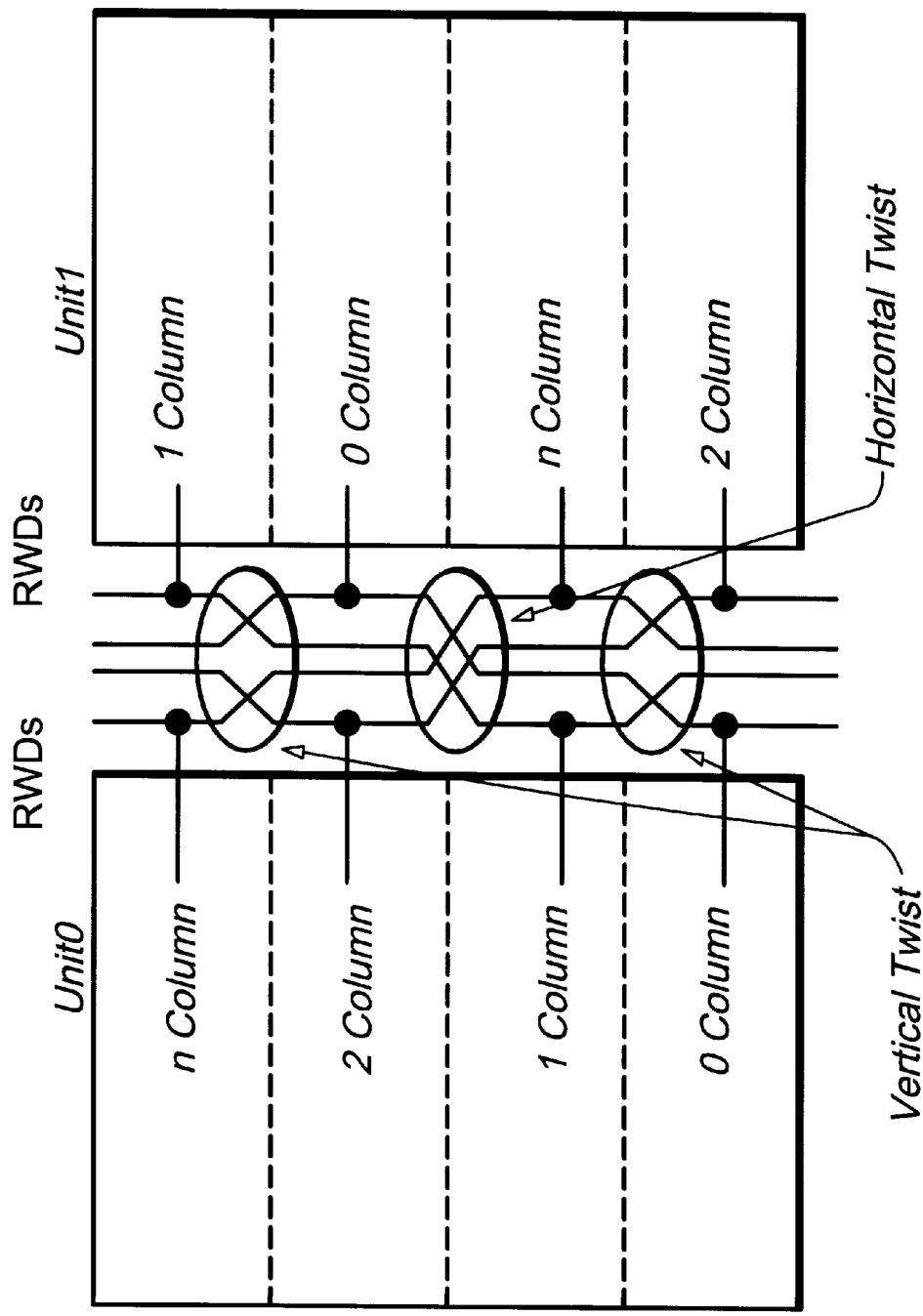
FIG. 6 is a block diagram illustrating two units of a semiconductor memory employing vertical and horizontal twisting of read write drive (RWD) lines that allows n-bit pre-fetch, according to an illustrative embodiment of the invention.

FIG. 6 is a block diagram illustrating two unite of a semiconductor memory employing vertical and horizontal twisting of read write drive (RWD) lines that allows n-bit pre-fetch, according to an illustrative embodiment of the invention. The 0 Column to n Column can be asymmetrically arranged in any combination to allow n-bit pre-fetch as long as there is a restriction upon opposing column blocks being identical. In FIG. 6, for example, 0 Column of Unit1 cannot be in the bottom space currently occupied by 2 Column of Unit1 to avoid duplicated RWD lines for 0 Column. As long as the columns with the same pre-fetch data are arranged in physically different segments, duplicated RWD lines can be avoided by twisting the RWD lines.

The twisting of the RWD lines is physically accomplished using a combination of metals. For example, the RWD lines use Metal Last or third level metal as they run through the units and are twisted using a lower level metal(s) (i.e. second and/or first level metals).

Figure 7:
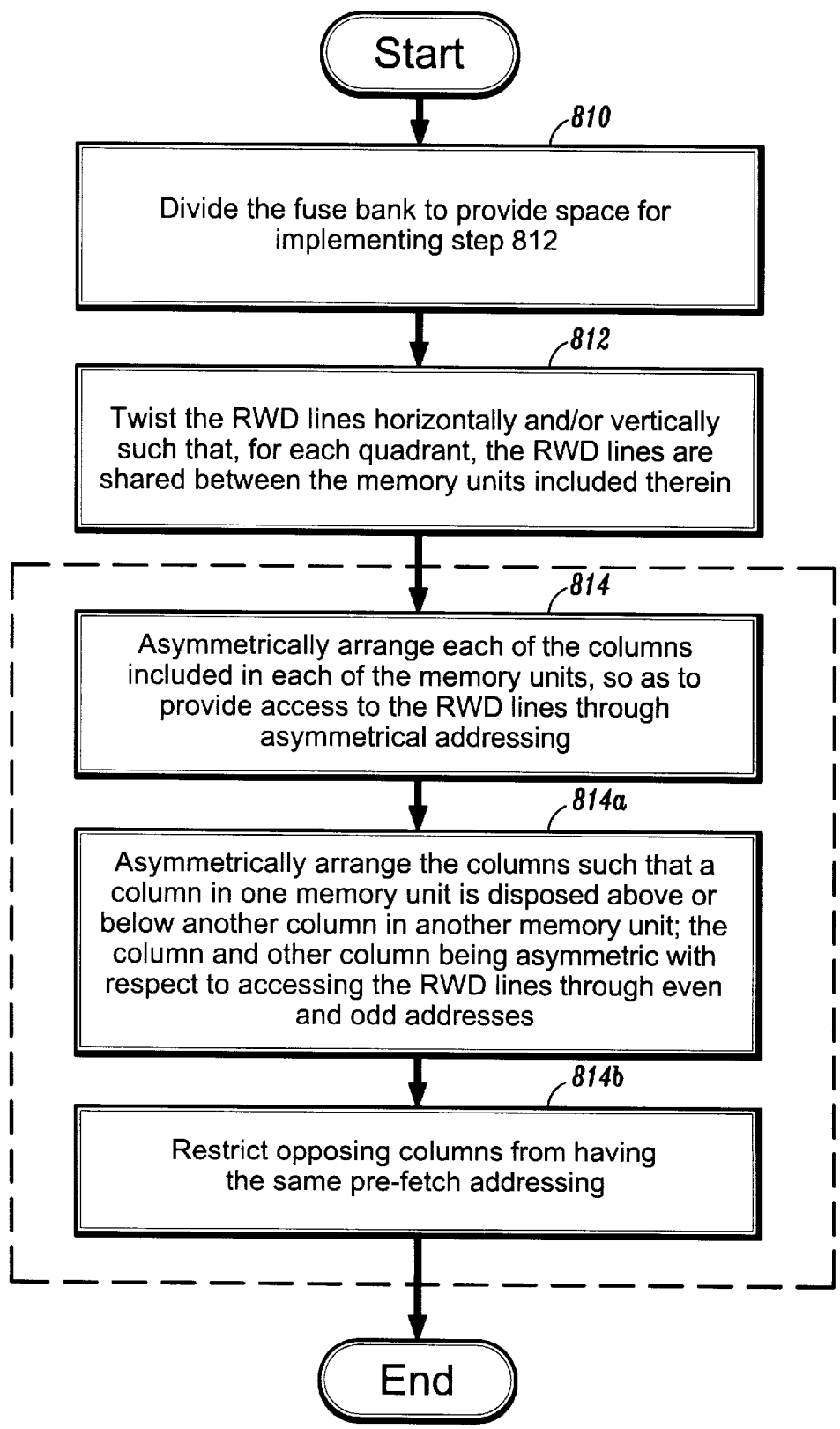
FIG. 7 is a flow diagram illustrating a method for reducing read write drive (RWD) lines in a semiconductor memory, according to an illustrative embodiment of the invention.

FIG. 7 is a flow diagram illustrating a method for reducing read write drive (RWD) lines in a semiconductor memory, according to an illustrative embodiment of the invention. The memory includes a plurality of memory units. Each of the plurality of memory units includes a plurality of columns. Moreover, the memory may include a fuse bank, which generally requires a break for any wiring.

The method includes the step of dividing the fuse bank to provide space for implementing the twisting step described at step 812 (step 810). At step 812, the RWD lines (e.g., orthogonal or diagonal metal lines) are twisted horizontally and/or vertically such that, for each of the plurality of quadrants, the RWD lines are shared between the plurality of memory units included therein.

Each of the plurality of columns included in each of the plurality of memory units are asymmetrically arranged, so as to provide access to the RWD lines through asymmetrical addressing (step 814).

step 814 includes the step of asymmetrically arranging each of the plurality of columns such that a column in one of the plurality of memory units is disposed above or below another column in another one of the plurality of memory units (step 814a). The column and the other column are asymmetric with respect to accessing the RWD lines through even addresses and odd addresses.

Step 814 may also include the step of restricting opposing columns from being identical (step 814b).

The present invention advantageously allows n-bit pre-fetch and the increased performance associated therewith. A further advantage is a reduction in the number of read write drive (RWD) lines by a factor of two or more. Another advantage is that the reduced number of RWD lines decreases the length of the semiconductor memory, thus resulting in higher yield and lower manufacturing costs. Yet another advantage is that by sharing the RWD lines, complex data multiplexing logic is eliminated. For example, in the prior art, a series of data multiplexers and logic circuits are necessary to select 16 of the 32 RWD lines. Other attendant advantages of the present invention are readily apparent to one of ordinary skill in the related art.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for reducing read write drive (RWD) lines in a semiconductor memory having a plurality of memory units, each of the plurality of memory units comprising a plurality of columns, said method comprising the steps of:

twisting the RWD lines at least one of horizontally and vertically such that the RWD lines are shared between the plurality of memory units; and asymmetrically arranging each of the plurality of columns comprised in each of the plurality of memory units, so as to provide access to the RWD lines through asymmetrical addressing.

2. The method according to claim 1, wherein said arranging step comprises the step of asymmetrically arranging each of the plurality of columns such that a column in one of the plurality of memory units is disposed one of above and below another column in another one of the plurality of memory units, the column and the other column being asymmetric with respect to accessing the RWD lines through even addresses and odd addresses.

3. The method according to claim 2, wherein the RWD lines comprise even RWD lines and odd RWD lines, and said arranging step shares the even RWD lines and the odd RWD lines between the plurality of memory units.

4. The method according to claim 2, wherein said arranging step further comprises the step of restricting opposing columns from having a same pre-fetch addressing.

5. The method according to claim 1, wherein the plurality of RWD lines comprises one of orthogonal and diagonal metal lines.

6. The method according to claim 1, wherein the semiconductor memory further comprises a fuse bank, and said method further comprises the step of dividing the fuse bank to provide space for implementing said twisting step.

7. A semiconductor memory having a plurality of memory units, said memory comprising:

a plurality of read write drive (RWD) lines at least one of horizontally and vertically twisted such that the RWD lines are shared between the plurality of memory units; and a plurality of columns comprised in each of the plurality of memory units, each of the plurality of columns being adapted to access the plurality of RWD lines through asymmetrical addressing.

8. The semiconductor memory according to claim 7, wherein each of said plurality of columns are asymmetrically arranged such that a column in one of the plurality of memory units is disposed one of above and below another column in another one of the plurality of memory units, the column and the other column being asymmetric with respect to accessing the RWD lines through even addresses and odd addresses.

9. The method according to claim 8, wherein the RWD lines comprise even RWD lines and odd RWD lines, and said arranging step shares the even RWD lines and the odd RWD lines between the plurality of memory units.

10. The semiconductor memory according to claim 8, wherein opposing columns are restricted from having a same pre-fetch addressing.

11. The semiconductor memory according to claim 7, wherein said plurality of RWD lines comprises one of orthogonal and diagonal metal lines.

* * * * *